United States Patent
Weaver et al.

(10) Patent No.: US 7,061,175 B2
(45) Date of Patent: Jun. 13, 2006

(54) EFFICIENCY TRANSPARENT CATHODE

(75) Inventors: Michael S. Weaver, Princeton, NJ (US); Min-Hao Michael Lu, Lawrenceville, NJ (US); Theodore Zhou, Princeton, NJ (US)

(73) Assignee: Universal Display Corporation, Ewing, NJ (US)

(*) Notice: Subject to any disclaimer, the term of this patent is extended or adjusted under 35 U.S.C. 154(b) by 111 days.

(21) Appl. No.: 10/219,761

(22) Filed: Aug. 16, 2002

(65) Prior Publication Data

US 2004/0032206 A1 Feb. 19, 2004

(51) Int. Cl.
*H10J 1/62* (2006.01)

(52) U.S. Cl. ............... 313/503; 313/506; 313/504; 445/24; 428/690

(58) Field of Classification Search ........... 313/504, 313/506, 503, 498; 445/24; 428/690, 917
See application file for complete search history.

(56) References Cited

U.S. PATENT DOCUMENTS

| | | | |
|---|---|---|---|
| 5,457,565 A | 10/1995 | Namiki et al. | |
| 5,703,436 A | 12/1997 | Forrest et al. | |
| 5,707,745 A * | 1/1998 | Forrest et al. | 428/432 |
| 5,739,635 A | 4/1998 | Wakimoto | |
| 5,776,622 A | 7/1998 | Hung et al. | |
| 5,834,893 A | 11/1998 | Bulovic et al. | |
| 5,844,363 A | 12/1998 | Gu et al. | |
| 6,013,384 A | 1/2000 | Kido et al. | |
| 6,097,147 A | 8/2000 | Baldo et al. | |
| 6,130,001 A * | 10/2000 | Shi et al. | 428/690 |
| 6,137,223 A * | 10/2000 | Hung et al. | 313/506 |
| 6,172,459 B1 * | 1/2001 | Hung et al. | 313/506 |
| 6,278,236 B1 | 8/2001 | Madathil et al. | |
| 6,303,238 B1 | 10/2001 | Thompson et al. | |
| 6,337,102 B1 | 1/2002 | Forrest et al. | |
| 6,337,492 B1 * | 1/2002 | Jones et al. | 257/40 |
| 6,509,109 B1 * | 1/2003 | Nakamura et al. | 428/690 |
| 6,579,629 B1 * | 6/2003 | Raychaudhuri et al. | 428/690 |
| 6,720,090 B1 * | 4/2004 | Young et al. | 428/690 |

OTHER PUBLICATIONS

Hung et al., "Interface engineering in preparation of organic surface–emitting diodes", May 24, 1999, Applied Physics Letters, V7 N21,3209–3211.*

Hung et al., "Sputter deposition of cathodes in organic light emitting diodes", Oct. 15, 1999, Journal of Applied Physics, V86 N8,4607–4612.*

Burrows et al., "Semitransparent cathodes for organic light emitting devices", Mar. 15, 2000, Journal of Applied Physics, V87 N6, 3080–3085.*

(Continued)

*Primary Examiner*—Edward J. Glick
*Assistant Examiner*—Elizabeth Keaney
(74) *Attorney, Agent, or Firm*—Kenyon & Kenyon LLP

(57) ABSTRACT

An organic light emitting device is provided. The device includes an anode, an organic layer disposed over the anode, a layer comprising an alkaline metal compound disposed over the organic layer, a layer comprising Mg or a Mg-metal alloy disposed over the layer comprising an alkaline metal compound, and a layer comprising a transparent conductive metal oxide disposed over the layer comprising Mg or Mg-metal alloy. A method of fabricating an organic light emitting device is also provided. An organic layer is deposited over an anode. An electron injection enhancement layer consisting essentially of an alkaline metal compound is deposited over the organic layer. A transparent cathode, including a layer of Mg or Mg-metal alloy and a layer of metal oxide, is deposited over the layer of alkaline metal compound. A device fabricated by this process is also provided.

29 Claims, 3 Drawing Sheets

OTHER PUBLICATIONS

U.S. Appl. No. 10/173,682, filed Jun. 18, 2002, entitled "Very Low Voltage, High Efficiency Pholed in a P–I–N Structure", to Forrest et al.

U.S. Appl. No. 09/931,948, filed Aug. 20, 2001, entitled "Transparent Electrodes", to Lu et al.

G. E. Jabbour et al., "Highly Efficient and Bright Organic Electroluminescent Devices with an Aluminum Cathode," Appl. Phys. Lett. , vol. 71, No. 13, Sep. 29, 1997, pp. 1762–1764.

Min–Hao Michael Lu, "External Coupling in Organic Light–Emitting Devices", A Dissertation Presented to the Faculty of Princeton University in Candidacy for the Degree of Doctor of Philosophy Recommended for Acceptance by the Department of Electrical Engineering, Jan. 2002.

Lu, et al., "External Coupling and cathode effects in organic light–emitting devices: modeling and experiments", Proceedings of SPIE, vol. 4464, pp. 187–196, 2002.

Lu, et al., "Optimization of external coupling and light emisson in organic light–emitting devices: modeling and experiment", Journal of Applied Physics, vol. 91, No. 2, pp. 595–604, Jan. 15, 2002.

Lu, et al., "Improved external coupling efficiency in organic light–emitting devices on high–index substrates", International Electron Devices Meeting 2000, San Francisco, CA, Technical Digest, pp. 607–610, Dec. 10–13, 2000.

Lu, et al., "External coupling efficiency in planar organic light–emitting devices", Applied Physics Letters, vol. 78, No. 13, pp. 1927–1929, Mar. 26, 2001.

* cited by examiner

EFFICIENCY TRANSPARENT CATHODE

FIELD OF THE INVENTION

The present invention relates to the field of organic light emitting devices, and more particularly to an organic light emitting device having a reduced drive voltage.

BACKGROUND OF THE INVENTION

Organic light emitting devices (OLEDs) are becoming increasingly desirable for a number of reasons. Many of the materials used to make such devices are relatively inexpensive, so organic light emitting devices have the potential for cost advantages over inorganic devices. In addition, the inherent properties of organic materials, such as their flexibility, may make them well suited for particular applications such as fabrication on a flexible substrate. In addition, the wavelength at which an organic emissive layer emits light may generally be readily tuned with appropriate dopants, while it may be more difficult to tune inorganic emissive materials.

OLEDs make use of thin organic films that emit light when voltage is applied across the device. OLEDs are becoming an increasingly popular technology for applications such as flat panel displays, illumination, and backlighting. OLED configurations include double heterostructure, single heterostructure, and single layer, and a wide variety of organic materials may be used to fabricate OLEDs. Representative OLED materials and configurations are described in U.S. Pat. Nos. 5,707,745, 5,703,436, 5,834,893, 5,844,363, 6,097,147 and 6,303,238, which are incorporated herein by reference in their entirety.

One or more transparent electrodes may be useful in an organic opto-electronic device. For example, OLED devices are generally intended to emit light through at least one of the electrodes. For OLEDs from which the light emission is only out of the bottom of the device, that is, only through the substrate side of the device, a transparent anode material, such as indium tin oxide (ITO), may be used as the bottom electrode. Since the top electrode of such a device does not need to be transparent, such a top electrode, which is typically a cathode, may be comprised of a thick and reflective metal layer having a high electrical conductivity. In contrast, for transparent or top-emitting OLEDs, a transparent cathode such as disclosed in U.S. Pat. Nos. 5,703,436 and 5,707,745 may be used. As distinct from a bottom-emitting OLED, a top-emitting OLED is one which may have an opaque and/or reflective substrate, such that light is produced only out of the top of the device and not through the substrate. In addition, a fully transparent OLED that may emit from both the top and the bottom.

As used herein, the term "organic material" includes polymers as wells as small molecule organic materials that may be used to fabricate organic opto-electronic devices. Polymers are organic materials that include a chain of repeating structural units. Small molecule organic materials may include substantially all other organic materials.

SUMMARY OF THE INVENTION

An organic light emitting device is provided. The device includes an anode, an organic layer disposed over the anode, a layer comprising an alkaline metal compound disposed over the organic layer, a layer comprising Mg or a Mg-metal alloy disposed over the layer comprising an alkaline metal compound, and a layer comprising a transparent conductive metal oxide disposed over the layer comprising Mg or Mg-metal alloy. A method of fabricating an organic light emitting device is also provided. An organic layer is deposited over an anode. An electron injection enhancement layer consisting essentially of an alkaline metal compound is deposited over the organic layer. A transparent cathode, including a layer of Mg or Mg-metal alloy and a layer of metal oxide, is deposited over the layer of alkaline metal compound. A device fabricated by this process is also provided.

DETAILED DESCRIPTION

An organic light emitting device (OLED) is provided that includes an alkaline metal compound in conjunction with a compound cathode. The alkaline metal compound may favorably reduce the operating voltage, increase the lifetime, and/or increase the efficiency of the OLED.

Figure 1:
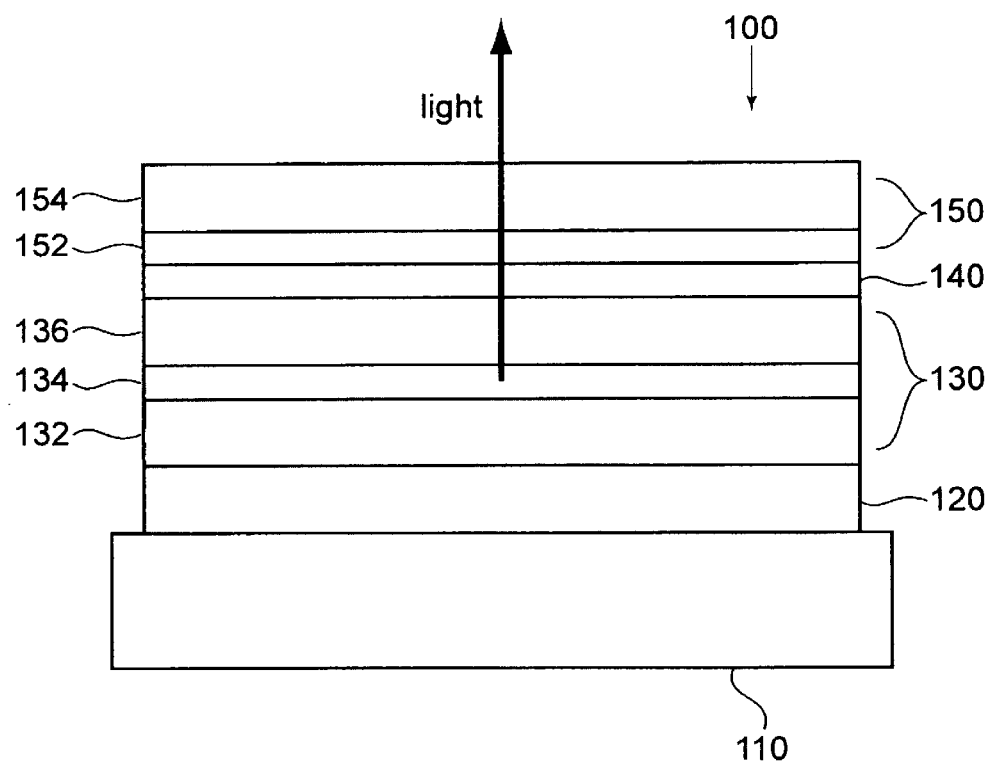
FIG. 1 shows an OLED having a transparent cathode in accordance with an embodiment of the present invention.

FIG. 1 shows an OLED 100 having a transparent cathode in accordance with an embodiment of the present invention. OLED 100 is fabricated by depositing an anode 120, an organic layer 130, a layer 140 of alkaline metal compound, and a cathode 150 on substrate 110, in that order.

Substrate 110 may be any suitable substrate known to the art. Ceramic, plastic, and glass are examples of suitable substrate materials. Substrate 110 may be flexible or inflexible. Substrate 110 may be transparent or opaque.

Anode 120 may be any suitable anode material known to the art. For devices 100 that emit light through substrate 110 to a viewer, anode 120 may be sufficiently transparent to transmit light to the viewer. A preferred transparent anode material is indium tin oxide (ITO).

Organic layer 130 may be any suitable organic material that emits light when sufficient current is passed between anode 120 and cathode 150. Organic layer 130 may also comprise organic layers in addition to an organic emissive layer, such as those of the double heterostructure configuration illustrated in FIG. 1, with a separate hole transport layer 132, emissive layer 134, and electron transport layer 136. Many organic hole transport, emissive, and electron transport materials are known to the art, and may be used with embodiments of the present invention. Organic layer 130 may comprise other configurations known to the art, such as single heterostructure or single layer. Organic layer 130 may include other layers not shown. For example, organic layer 130 may include blocking layers adapted to confine charge carriers in emissive layer 134, which are described in more detail in U.S. patent application Ser. No. 10/173,682 to Forrest et al., filed Jun. 18, 2002, which is incorporated by reference in its entirety. Organic layer 130 may include a buffer layer disposed beneath cathode 150, that protects underlying organic layers during the deposition of cathode 150, as described in more detail in U.S. patent application Ser. No. 09/931,948 to Lu et al., filed Aug. 20, 2001, which is incorporated by reference in its entirety. Organic layer 130 may include other layers that provide an advantage to device 100. Preferably, the emissive layer is a phosphorescent material, due to the high efficiencies associated with such materials, but other types of materials, such as fluorescent materials, may also be used. Organic layer 130 may be deposited by any technique known to the art, including organic vapor phase deposition (OVPD), such as disclosed in U.S. Pat. No. 6,337,102, which is incorporated herein by reference in its entirety, and thermal vapor phase deposition.

Layer 140 consists essentially of an alkaline metal compound. Preferred alkaline metal compounds include alkaline halides, LiF, LiO, and Li2O. Preferably, layer 140 is about 0.1 to 5 nm thick, and more preferably about 0.5 to 3 nm thick. Thinner layers may not contain enough alkaline metal compound to favorably and significantly affect device properties. Thicker layers may contain too much alkaline metal compound, such that device properties may drive voltage may undesirably increase. It is believed that layer 140 may not remain intact as the remainder of device 100 is fabricated. In particular, it is believed that the alkaline metal compound may dissociate, and the alkaline metal, such as Li, diffuses into organic layer 130. For LiF, it is believed that the F bonds with a constituent of cathode 150, such as Mg or Al. Whether or not layer 140 remains intact, it is believed that the deposition of layer 140 significantly enhances the performance of device 100. Layer 140 may be referred to as an "electron injection enhancement layer" because it is believed to enhance the injection of electrons from cathode 150 into organic layer 130. Layer 140 may be deposited by any suitable technique, including sputtering, e-beam deposition, and thermal vapor phase deposition. As used herein, a "layer" of alkaline metal compound is intended to encompass the result of depositing an alkaline metal compound, even if there is dissociation and/or diffusion. The result of the dissociation and/or diffusion may be referred to as "doping" of the surrounding layers.

Cathode 150 may comprise multiple layers. In particular, cathode 150 may comprise a layer 152 of Mg or Mg alloy, and a layer 154 of metal oxide, deposited in that order. Preferred Mg alloys include Mg:Ag having a weight ratio of about 10:1 to 25:1. Preferably, the metal oxide is a transparent electrically conductive metal oxide. Preferred metal oxides include indium tin oxide (ITO), and indium zinc oxide (IZO). Cathode 150 may be deposited by any suitable technique, including sputtering, thermal vapor phase deposition, laser ablation, and e-beam. Sputtering is a preferred method.

While not intending to be limited as to any particular theory as to how or why the invention works, it is believed that the deposition of layer 154 of metal oxide over layer 152 of Mg or Mg alloy affects underlying layer 140 of alkaline metal compound. In particular, the deposition of ITO, whether by the preferred sputtering method or another method, may dissociate the alkaline metal compound, allowing for the dissociation, diffusion, and/or bonding of the atomic constituents of layer 140, which may lead to improved device performance.

Experimental

Several OLEDs were fabricated to demonstrate the effectiveness of embodiments of the present invention. The anode and organic layers of each OLED were the same. Specifically, each OLED was fabricated on a plastic substrate pre-coated with an ITO anode. A layer of CuPc was deposited to a thickness of about 10 nm thick was deposited over the ITO anode to improve hole injection and device lifetime. A hole transport layer of 4,4'-[N-(1-naphthyl)-N-phenyl-amino]biphenyl (NPD) was deposited to a thickness of about 30 nm over the CuPc. An emissive layer of 4,4'-N,N'-dicarbazole-biphenyl (CBP) doped with fac-tris(2-phenylpyridine)-iridium (Ir(ppy)$_3$) was deposited to a thickness of 30 nm over the NPD. A hole blocking layer of aluminum(III)bis(2-methyl-8-quinolinato)4-phenylphenolate (BAlq) was deposited to a thickness of about 10 nm over the emissive layer. An electron transport layer of 8-tris-hydroxyquinoline aluminum (Alq3) was deposited to a thickness of about 40 nm over the BAlq.

A first device was fabricated by depositing an electrode over the Alq3. First, a layer of Mg:Ag, 10:1 by weight, was deposited over the Alq3 to a thickness of about 10 nm. Then, a layer of ITO was deposited over the Alq3 to a thickness of about 50–80 nm.

A second device was fabricated, similar to the first, except a layer of LiF about 0.5–1 nm thick was deposited after the Alq3 and before the Mg:Ag.

A third device was fabricated, similar to the first, except, the Mg:Ag was deposited to a thickness of 100 nm, and the ITO was omitted. LiF was not deposited.

A fourth device was fabricated, similar to the third, except a layer of LiF about 0.5–1 nm thick was deposited after the Alq3 and before the Mg:Ag.

In each of the devices, the substrate and anode were purchased from Applied Film Corp. of Longmont, Calif. Each of the organic layers were deposited by thermal vapor phase deposition. The LiF and Mg:Ag were deposited by thermal vapor phase deposition. ITO was deposited by sputtering.

Figure 2:
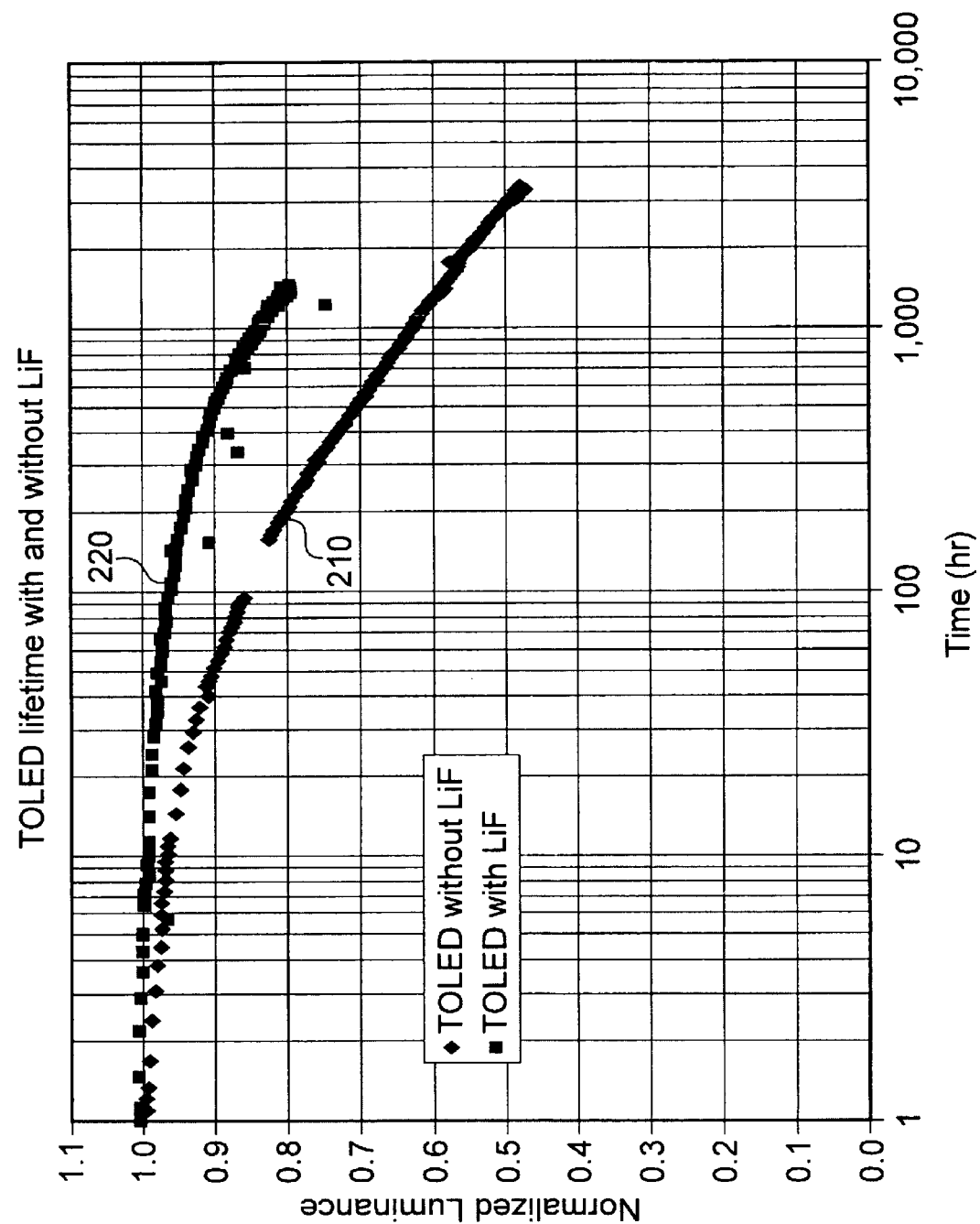
FIG. 2 shows the normalized luminance as a function of time for a device including LiF and a device not including LiF.

FIG. 2 shows the normalized luminance of the first and second devices as a function of time, when driven at a constant current. Plot 210 shows the normalized luminance of the first device, which does not have LiF. Plot 220 shows the normalized luminance of the second device, which has LiF. The luminance of the device having LiF advantageously decays much slower than that of the device without LiF.

Figure 3:
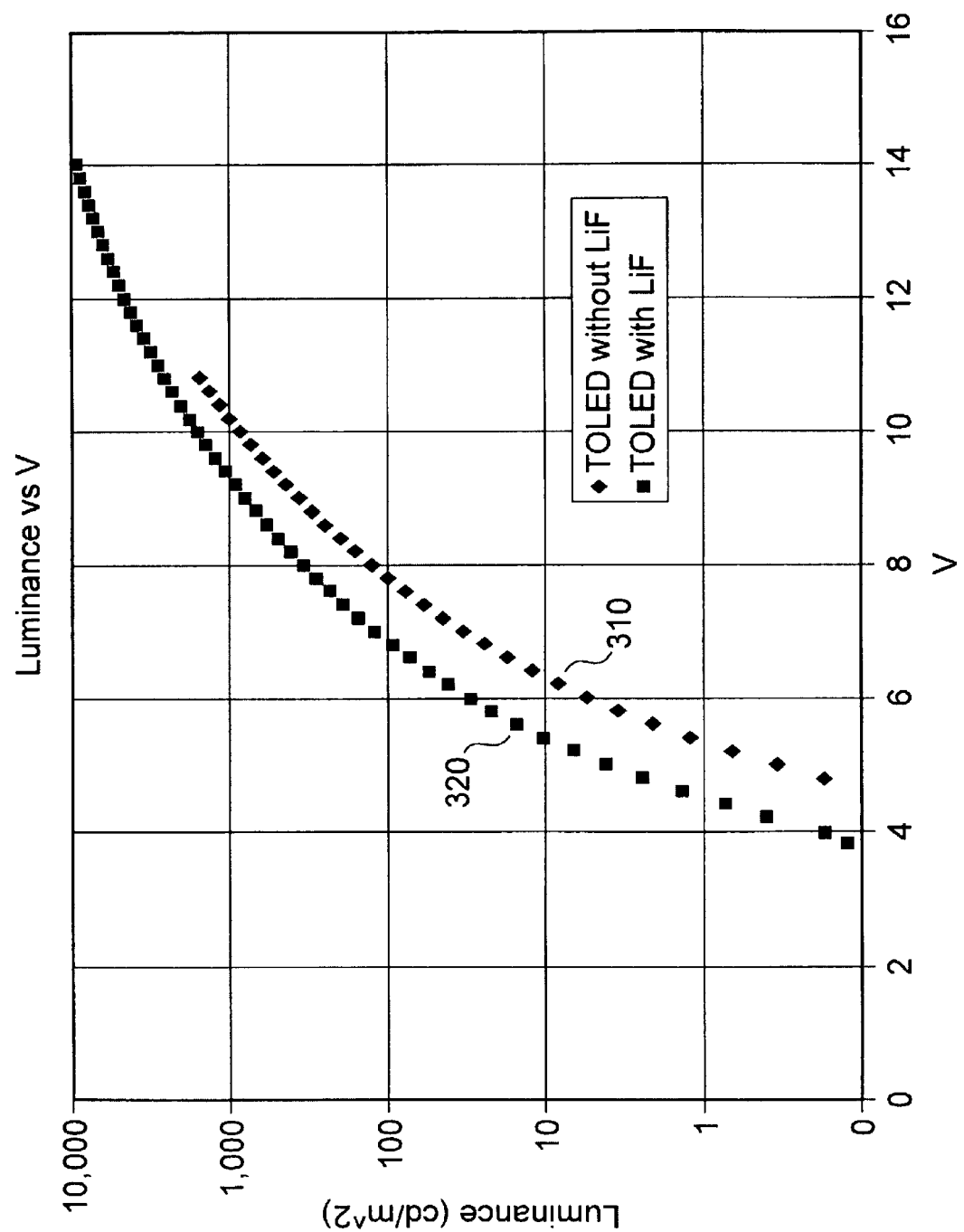
FIG. 3 shows luminance as a function of voltage for a device including LiF and a device not including LiF.

FIG. 3 shows the luminance of the first and second devices as a function of voltage. Plot 310 shows the luminance of the first device, which does not have LiF, and plot 320 shows the luminance of the second device, which has LiF. The luminance of the device having LiF is advantageously greater across a range of voltages. As a result, where a particular level of luminance is desired, the device having LiF has a lower operating voltage, which is a desirable characteristic. In addition, the second device was measured to be about 5% more efficient than the first device.

The third device was compared to the fourth device. The devices were monitored for reduction in efficiency and increase in drive voltage over time. No difference in operating voltage, device lifetime, or efficiency was noticed. This comparison demonstrates that a layer of alkaline metal compound such as LiF between the organic layers and an Mg:Ag cathode may not improve device performance unless there is a process performed subsequent to the Mg:Ag deposition, such deposition of ITO, that affects the alkaline metal compound.

Based on the various experimental results described herein, a significant improvement is seen when a layer of alkaline metal compound is used in conjunction with a compound cathode having a Mg or Mg-metal alloy layer, such as Mg:Ag, and a conductive metal oxide layer, such as ITO. It is believed that there is a significant and surprising interaction between the alkaline metal compound and the compound electrode. For example, the deposition of the conductive metal oxide may dissociate the alkaline metal compound. The alkaline metal may then diffuse into the organic layers, and the remainder of the alkaline metal compound may bond with the Mg. As a result, a significant and surprising improvement in device performance is observed with the specific combination of an alkaline earth metal with a compound cathode including Mg and a metal oxide, that is not present when a layer of alkaline metal compound is used with a cathode having Mg but that does not include metal oxide, or when a compound cathode is used without an LiF layer.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device, comprising:
   (a) an anode;
   (b) an organic layer disposed over the anode;
   (c) a layer comprising an alkaline metal compound disposed over the organic layer;
   (d) a layer comprising Mg or a Mg-metal alloy disposed over the layer comprising an alkaline metal compound, and
   (e) a layer comprising a transparent conductive metal oxide disposed over the layer comprising Mg or Mg-metal alloy.

2. The device of claim 1, wherein the layer comprising an alkaline metal compound consists essentially of an alkaline halide.

3. The device of claim 1, wherein the layer comprising Mg or a Mg-metal alloy consists essentially of Mg or a Mg metal alloy.

4. The device of claim 1, wherein the layer comprising Mg or a Mg-metal alloy consists essentially of Mg:Ag.

5. The device of claim 1, wherein the layer comprising a transparent conductive metal oxide consists essentially of indium tin oxide.

6. The device of claim 1, wherein the layer comprising a transparent conductive metal oxide consists essentially of indium zinc oxide.

7. The device of claim 1, wherein:
   the layer comprising an alkaline metal compound consists essentially of an alkaline metal compound;
   the layer comprising Mg or Mg-metal alloy consists essentially of Mg:Ag; and
   the layer comprising a metal oxide consists essentially of indium tin oxide.

8. The device of claim 1, wherein the layer comprising alkaline metal compound comprises LiF.

9. The device of claim 1, wherein the layer comprising alkaline metal compound consists essentially of LiF.

10. The device of claim 1, wherein the layer comprising alkaline metal compound comprises LiO.

11. The device of claim 1, wherein the layer comprising alkaline metal compound consists essentially of LiO.

12. The device of claim 1, wherein the layer comprising an alkaline metal compound has a thickness of about 0.3 to 5 nm.

13. The device of claim 1, wherein the layer comprising an alkaline metal compound has a thickness of about 0.5 to 1 nm.

14. The device of claim 1, wherein the organic layer further comprises a layer consisting essentially of CuPc, a layer consisting essentially of NPD, a light emitting layer, a layer consisting essentially of BAlq, and a layer consisting essentially of Alq3, disposed in that order over the anode.

15. The device of claim 1, wherein the device is incorporated into an active matrix display.

16. An organic light emitting device, comprising:
   (a) an anode;
   (b) an organic layer disposed over the anode;
   (c) a layer comprising Mg or a Mg-metal alloy disposed over the organic layer,
   (d) a layer comprising a transparent conductive metal oxide disposed over the layer comprising Mg or Mg-metal alloy,
   (e) means for enhancing the injection of electrons from the layer comprising Mg or a Mg-metal alloy into the organic layer.

17. The device of claim 16, wherein the means for enhancing the injection of electrons includes LiF.

18. A device fabricated by the process of:
   (a) depositing an organic material over an anode;
   (b) depositing an alkaline metal compound over the organic material;
   (c) depositing Mg or a Mg-metal alloy over the alkaline metal compound; and
   (e) depositing a metal oxide over the Mg or Mg-metal alloy.

19. The device claim 18, wherein the alkaline metal compound if LiF.

20. The device of claim 18, wherein the Mg or Mg-metal alloy is Mg:Ag.

21. The device of claim 18, wherein the metal oxide is indium tin oxide.

22. The device of claim 18, wherein the metal oxide is deposited by sputtering.

23. The device of claim 18, wherein the metal oxide is deposited by thermal vapor phase deposition.

24. A method of fabricating an organic light emitting device, comprising:
   (a) depositing an organic layer over an anode;
   (b) depositing an electron injection enhancement layer consisting essentially of an alkaline metal compound over the organic layer; and
   (c) depositing a transparent cathode, including a layer of Mg or Mg-metal alloy and a layer of metal oxide, over the layer of alkaline metal compound.

25. The method of claim 24, wherein the electron injection enhancement layer is deposited by thermal deposition.

26. The method of claim 24, wherein the electron injection enhancement layer includes LiF.

27. The method of claim 24, wherein the metal oxide layer is deposited by sputtering.

28. The method of claim 24, wherein the metal oxide layer is deposited by thermal vapor phase deposition.

29. An organic light emitting device, comprising:
   (a) an anode;
   (b) an organic layer disposed over the anode;
   (c) a layer comprising Mg or a Mg-metal alloy disposed over the organic layer, and
   (d) a layer comprising a transparent conductive metal oxide disposed over the layer comprising Mg or Mg-metal alloy;
   wherein the organic layer includes an alkaline metal dopant, and the layer comprising Mg or Mg-metal alloy includes fluorine or oxygen as a dopant.

* * * * *